United States Patent [19]

Lemelson

[11] Patent Number: 5,096,352
[45] Date of Patent: Mar. 17, 1992

[54] DIAMOND COATED FASTENERS

[76] Inventor: Jerome H. Lemelson, 48 Parkside Dr., Princeton, N.J. 08540

[21] Appl. No.: 489,499

[22] Filed: Mar. 7, 1990

Related U.S. Application Data

[63] Continuation-in-part of Ser. No. 32,352, Mar. 31, 1987, Pat. No. 4,960,643.

[51] Int. Cl.⁵ .......................... F16B 35/04; B01J 3/06
[52] U.S. Cl. .................................. 411/424; 411/902; 411/914; 423/446
[58] Field of Search ............... 411/411, 424, 388, 389, 411/366, 900–903, 908, 914; 427/39, 45.1; 423/446

[56] References Cited

U.S. PATENT DOCUMENTS

| | | | |
|---|---|---|---|
| 3,099,083 | 7/1963 | DeLong | 411/902 |
| 3,361,448 | 1/1968 | Warrington | 411/389 |
| 4,005,163 | 1/1977 | Bokros | 252/12 X |
| 4,074,011 | 2/1978 | Teramae et al. | 411/914 |
| 4,214,037 | 7/1980 | Galasso et al. | 428/902 X |
| 4,554,208 | 11/1985 | MacIver et al. | 428/408 X |
| 4,663,183 | 5/1987 | Ovshinsky et al. | 427/39 |
| 4,802,807 | 2/1989 | Offenburger et al. | 411/902 |
| 4,882,138 | 11/1989 | Pinneo | 423/446 |

FOREIGN PATENT DOCUMENTS

| | | | |
|---|---|---|---|
| 2926080 | 1/1981 | Fed. Rep. of Germany | 252/29 |
| 195094 | 10/1985 | Japan | 423/446 |

Primary Examiner—Neill R. Wilson

[57] ABSTRACT

Fasteners and fastening devices made of metals, metal alloys, hard high strength ceramic material and the combination of same, are provided wherein all, a select portion or portions of the fasteners are coated with a thin layer or film of synthetic diamond material which is operable to enhance their strength and surface characteristics, insulating ability and resistance to heat and chemical corrosion attack. In one form, a machine screw is totally coated with a thin layer or film of synthetic diamond material. In another form, a select portion of the fastener is so coated. A thin coating of chromium or other suitable solid material is deposited on the outer surface of the diamond coating to protect same against physical attrition during its application and use. In another form, just the threads of machine screws and the like are diamond coated to protect same against corrosion. In a third form, a machine nut is entirely coated with synthetic diamond material which may contain a coating of chromium or the like deposited on the outer surface of the diamond material. In a fourth form, just the threads of such a machine nut are so coated. Other forms of the invention include improved fasteners in the form of pins and non-threaded bolts or the like which are totally or partially coated with synthetic diamond material and, in such instances, overcoated with a thin plating of chromium.

19 Claims, 2 Drawing Sheets

DIAMOND COATED FASTENERS

RELATED APPLICATIONS

This is a continuation-in-part of application Ser. No. 032,352 filed Mar. 31, 1987 now U.S. Pat. No. 4,960,643.

SUMMARY OF THE INVENTION

This invention relates to improvements in fasteners which are totally or partially protected against heat and chemical corrosion as well as surface attrition and, in certain instances, are enhanced in strength by means of a layer of synthetic diamond material deposited in situ thereon. In certain instances, the synthetic diamond material contains a thin plating of chromium or other solid lubricant, which serves to protect same against attrition during use. In certain instances, portions of the fasteners are void of synthetic diamond coating material which portions are protected against corrosion or erosive effects when they engage respective surfaces of work during use.

It is a primary object of this invention to provide new and improved structures in fasteners which are totally or partially coated with hard synthetic diamond material applied thereto as carbon atoms deposited from a carbon atom containing gas or gas mixture located adjacent the surface or surfaces of the fasteners, when radiation, such as microwave radiation, is beamed through the gas or gas mixture against the fastener surfaces causing the carbon atoms to deposit as a thin coating or film thereon and to become bonded as a hard diamond layer against the surfaces so coated.

Another object is to provide fasteners of the threaded type wherein the threads of the fastener are protected against corrosion and erosion during use by means of a hard diamond or diamond-like material coating same.

Another object is to provide new and improved fasteners, a select portion or portions of which are coated with a hard thin diamond layer operable to protect same against corrosion and erosion and, in certain instances, to enhance the strength of such fasteners.

Another object is to provide new and improved structures in threads of threaded members employed to effect assemblies and in machine operation, which threads or threaded members contain a thin film of synthetic diamond material and an overcoating of chromium to protect same, wherein the combination of the diamond material and the chromium greatly enhance the life of the threaded elements.

Another object is to provide a new and improved threaded fastener wherein the threads thereof are enhanced in strength by a coating of synthetic diamond material.

Another object is to provide improvements in threaded fasteners wherein the threads thereof are protected against surface failure and destruction due to the extension of surface cracks and the like.

Another object is to provide improvements in threaded fasteners wherein the threads thereof will not bind, rust or otherwise degrade during long use.

Another object is to provide new and improved machine screws, nuts and bolts having superior physical characteristics.

With the above and such other objects in view as may hereinafter more fully appear, the invention consists of the novel structures, article constructions and methods described in the following specification and illustrated in the drawings, but it is to be understood that variations and modifications may be resorted to which fall within the scope of the invention as claimed without departing from the nature and spirit of the invention.

BRIEF DESCRIPTION OF THE DRAWINGS

In FIG. 1 is shown a fastener 10 in the form of a machine screw or bolt which is formed by machining, forging or molding a suitable metal, high strength plastic or ceramic material. The fastener 10 is formed with a hexagonally shaped head portion 11 extending to an elongated shank portion 15 having a smooth cylindrical portion 16 next to the head 11. The remaining portion 17 of the shank 15 is formed with a helical thread 18 machined, rolled or molded therein, to be turned and threaded into a threaded hole in a work piece, nut or other auxiliary member cooperating therewith in fastening work or work elements together. The head 11 contains a flat upper surface 12 and a flat undersurface 13, although it may have any suitable shape, such a rounded head 11A with a slot 14 for a screwdriver to turn the fastener as shown in FIG. 2.

In FIG. 2 the slotted cavity 14 extends partly across the head 11A to receive a conventional screw driver blade or the like for tightening or removing the fastener from a work piece. The cavity 14 is shown open at its end although it may also be closed and shaped to receive and conform to the end of a wrench, such as an Allen wrench or Phillips head screw driver. The flat undersurface 13A of the head may also be shaped to effect a thread locking action when tightened against a work surface or such action may be effected by properly shaping the endmost of the threads.

Respective surface portions of the fastener 10 include the rounded upper surface 12A of the head 12, the cylindrical outer surface 15A of the upper portion of the shank 15, the side walls 18A of the helical thread formation 18 and the surface 15B of the end of the shank 15.

Figure 1:
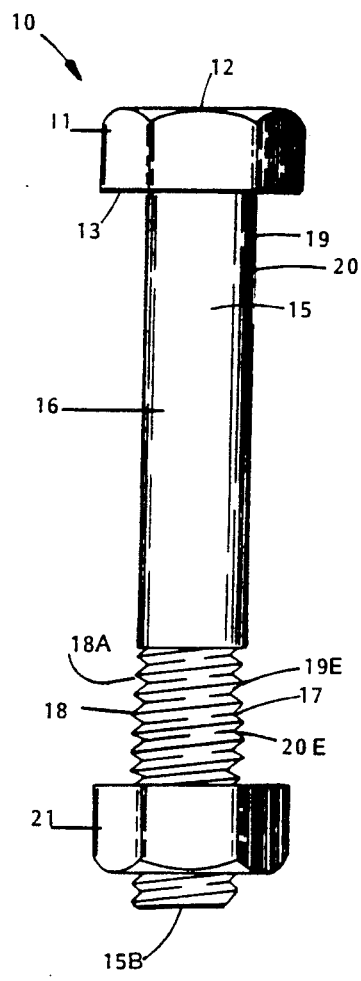
FIG. 1 is a side view of a threaded fastener embodying features of the invention.

The fastener 10 of FIG. 1 may have all or select portions of its surface coated with a thin film or layer 19 of hard, synthetic diamond material formed in situ thereon by deposition, such as by passing intense radiation such as microwave radiation, through a suitable gas or fluid containing atoms of carbon, in such a manner as to cause such carbon atoms to become deposited as a thin layer of hard synthetic diamond or diamond-like material against said outer surface, preferably although not necessarily as defined in my U.S. Pat. No. 4,859,493.

Notation 19A refers to that portion of the diamond material coating the upper rounded surface 12A of the head 11A; notation 19B to that portion of the diamond coating disposed against the flat bottom surface 13A of the head 11A notation 19C to that portion of the diamond coating disposed against the side and bottom walls of the slotted cavity 14; notation 19D to that portion of the diamond coating disposed against the cylindrical upper surface of the shank 15; notation 19E to that portion of the diamond coating disposed against the surfaces of the thread or threaded formation extending helically around the lower portion of the shank 15 and notation 19F to that portion of the diamond coating disposed against the end of the shank 15.

Depending on the intended application or applications of the fastener 10, the thin coating of synthetic diamond material may be disposed against any of the described surface portions of the fastener or any combination thereof to the exclusion of one or more of the other surface portions thereof. For example, the spiral surfaces of the threads 17 of the fastener may contain such synthetic diamond material coating or film to the exclusion of the other portions of the fastener, for protecting same against chemical corrosion, wear, spalling or stress crack failure caused when a microcrack or cracks in the surface stratum of the material thereof expands without restraint due to tensile and/or compressive forces applied to the fastener through the threads thereof. Such coating may also be applied to the exposed upper surface 12 of the head including the surfaces of the cavity 14 and/or to the bottom surface 13 of the head to protect same against corrosion and the extension of surface defects.

For certain fastener applications it may be desireable to protect the outer surface of the diamond film from erosion. Accordingly, a thin layer 20 of protective metal, alloy, oxide, nitride or carbide of such metals as chromium, vanadium, aluminum, titanium, molybdenum or other metal may be plated or vapor deposited against the outer surface of the diamond coating 19.

Figure 2:
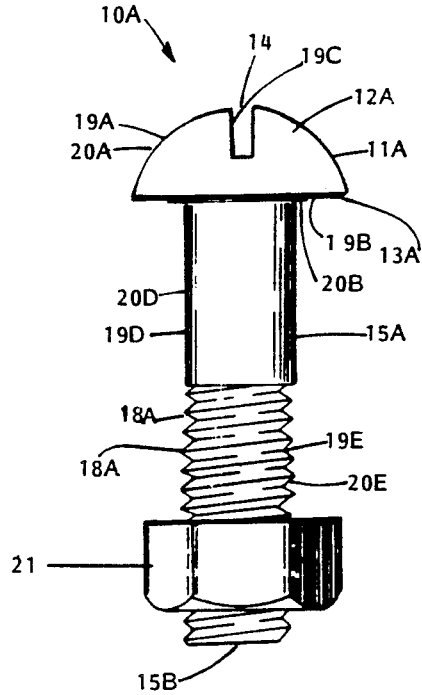
FIG. 2 is a side cross sectional view of a nut embodying features of the invention.
Figure 3:
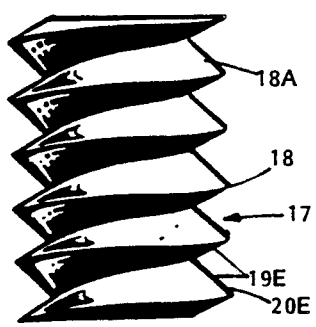
FIG. 3 is a side cross sectional view of a portion of the structures of the fasteners of FIGS. 1 and 2.

The fasteners of FIGS. 1 and 2 may also contain one or more washers or locking devices secured beneath the head 11 or to the threaded portion thereof. Such locking device or devices may contain a hard synthetic diamond material formed thereon by the deposition of carbon atoms from carbon atom containing molecules, such as methane gas through which high energy radiation, such as microwave radiation, is passed to the surface or surfaces of the fastener.

Figure 4:
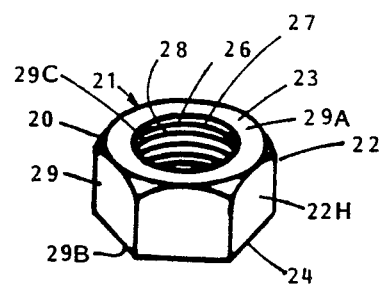
FIG. 4 is a perspective view of a hexagonal nut embodying features of the invention.

In FIG. 4 is shown a machined, forged or molded fastener component 21, such as a hexagonal or otherwise shaped nut formed of metal, plastic or ceramic material defining a solid body 22 having parallel upper and lower flat surfaces 23 and 24 and a hexagonally shaped flat faceted side wall 22H. Extending through the center of the body 22 is a cavity or passageway 26, the side wall 27 of which is formed with an internal helical thread formation 28 which may be molded, rolled or machined therein. Coating the entire exposed surface of the nut body 22 including the surfaces 23 and 24, and the threaded interior surface of the passageway 26, is a thin film of synthetic diamond or diamond-like material 29. Notations 29A to 29C refer respectively to those portions of the thin diamond coating 27 which cover the faces 23 and 24, the side wall 22H and the surfaces of the hole or thread formation defining the inside surface of the wall of the hole.

The coatings 19 and 20 of FIGS. 1 and 2 may cover select portions of the fastener and nut or the entire exposed surfaces thereof and may be applied by means described in U.S. Pat. No. 4,859,493 in thicknesses which may vary from a few millionths of an inch to a thousandth of an inch or more depending on the corrosive and erosive atmospheres to which the fasteners are to be subjected during use as well as the forces expected to be applied to such fastener. Since the diamond film also serves as an electrical insulator, the corrosive effects experienced by electro-chemical attack, may be reduced substantially by the use of such coating or film of synthetic diamond material. Thicker films in the order of 0.001" to 0.001" may be provided to substantially enhance the strength and resistance to tensile and vibrational failure caused when microcracks formed in the outer stratum of the fastener material during machining or otherwise forming same expand as a result of forces applied to the fastener during use. Such diamond film may also serve to increase the tensile strength and resistance to corrosion, particularly of the threaded portion of the fastener.

Figures 5, 6:
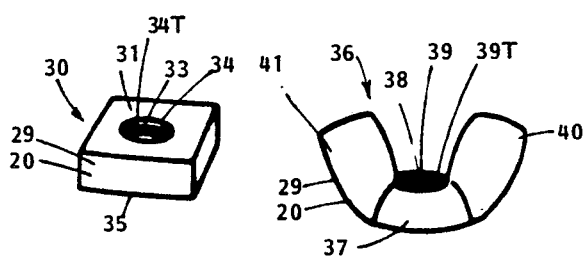
FIG. 5 is a perspective view of a square nut embodying features of the invention.
FIG. 6 is a perspective view of a wing nut embodying features of the invention.

FIG. 5 shows a square nut 30 having a rectangular shape with a flat top wall 31 and a flat bottom wall 35 and four flat wall portions 32. A cylindrical hole 33 is centrally drilled between surfaces 31 and 35 and a thread is formed in its side-wall 34. Coating the entire surface of the nut including the thread formation 34T is a synthetic diamond material which may be deposited and bonded to the surfaces of the nut as set forth in my copending application Ser. No. 032,352.

In FIG. 6 is illustrated a wing-nut 36 having a central body portion 37 with a cylindrically shaped hole 38, the wall 39 of which contains a helical thread formation 39T. Tabs or ears 40 and 41 are integrally cast with the central body portion and serve as finger gripping means for turning the nut. The entire outer and treaded surfaces of the fastener 36 are coated with a synthetic diamond material as described which serves to protect it from corrosion and failure due primarily to the extension of surface defects and corrosion.

In modified forms of the invention illustrated in FIGS. 1 and 2, only a select portion or portions of the fasteners illustrated may be coated with diamond film to protect same against wear, corrosion and the effects of surface irregularities such as cracks, during the production thereof, which would normally cause failure of the fastener when subjected to high stress and vibrational forces during use. For example, the threads 18 of the machine screw or bolt 10 of FIG. 1 and the threads 26 of the nut 20 of FIG. 2 may be coated with synthetic diamond film to the exclusion of other portions of the fastener, to protect same from chemical corrosion and physical destruction, which diamond film may be overcoated or plated with a thin layer of chromium serving to protect the surface of the diamond film. The entire surface of the fastener 20 with the exception of the undersurface 13 of the head or an anular portion [not shown] thereof may be coated with such diamond film and chromium materials in a coating process in which such surface 13 or an annular portion thereof near the shank rests against a retaining surface by gravity or is gripped by the retaining device during the process in which such synthetic diamond film is deposited in a reaction chamber containing methane gas, for example, into which microwave energy is beamed. Similarly, the bottom surface 24 of the nut 20, or an anular portion thereof, which engages the work against which the nut is drawn, may be void of synthetic diamond material as a result of engagement thereof against the surface of a retaining means during a coating operation.

Such portions of the fasteners 10 and 20 which are not coated with diamond material, may be chromium plated in an operation in which the fasteners are tumbled in a plating drum or barrel after application of the synthetic diamond film thereto. It is noted that the annular portion of such fasteners which are not coated with synthetic diamond material may be protected against corrosion when it engages the work surface as the fastener is tightened thereagainst. Such annular portion may be immediately adjacent the shank or threaded hole or outwardly therefrom.

A variety of other fasteners may be similarly coated with synthetic diamond material and chromium or other suitable solid lubricant to increase the strength thereof, protect the surfaces of such fasteners against surface failure during use, protect the fastener materials against chemical and heat corrosion as well as physical attrition and, in certain instances, insulate the fasteners electrically. Such fasteners as jam and castellated nuts, lock nuts, pins, rivets, threadless shear bolts or the like may be similarly coated and plated with synthetic diamond and chromium materials to greatly improve their physical and chemical characteristics and prevent failure during use. Nails, drive pins, and other piercing devices which are suject to surface attrition and failure during application and use may also be similarly coated with synthetic diamond material with or without a protective solid film or layer of chromium or other material applied to the surface of the synthetic diamond material. Similarly, fastening devices such as lock washers and metal seals applied to fasteners and other mechanical assemblies may also be similar by single or double coated to protect same against corrosion, erosion during application and use and the extension of surface defects caused by heavy loading and impact forces. Fasteners which are welded or brazed to assemblies or components may also be similarly single or double coated with synthetic diamond material and chromium or the like as may the welds therefore which may be so coated after welding is complete or during the welding operation to protect same from corrosion, the formation and extension of surface cracks during the application of force and impacts to the fastened components.

The coatings of synthetic hard diamond or diamond-like material applied to the entire articles or select portions of such articles subjected to frictional wear, weathering, temperature or chemical corrosive effects, and destruction caused by the expansion of surface defects such as surface cracks formed during fabrication, may be formed of carbon atoms deposited thereon from gas, vapor or liquid molecules containing such carbon atoms, as a result of passing high intensity radiation, such as microwave radiation or the like, through such carbon atom containing fluids, by means shown and described in my parent application Ser. No. 32,307, now U.S. Pat. No. 4,859,493, in thicknesses which may vary from a few millionths of an inch to a thousandth of an inch or more depending on the expected use of the articles or assemblies including the corrosive and erosive atmosphere to which they are subjected. Thicker films in the order of 0.0001" to 0.001" or more may be provided to substantially enhance the tensile and compressive strengths of the articles or components. Where the article or component is subjected to movement and abrasion or frictional wear during use, which wear or abrasion may have a detrimental effect on the diamond film or coating, a thin coating of a solid lubricant protective material, such as chromium, chromium alloys or the like, may be applied over the diamond coating after it is formed in situ on the substrate or select portion of the outer surface thereof. Such chromium may also be deposited as chromium atoms present in the gas, vapor or liquid disposed adjacent the surface of the article, while carbon atoms are deposited or sequentially after the deposition of carbon atoms to provide either a composite layer of carbon and chromium atoms or one or more layers of carbon atoms interposed between one or more layers of chromium atoms or coatings thereof.

Figure 7:
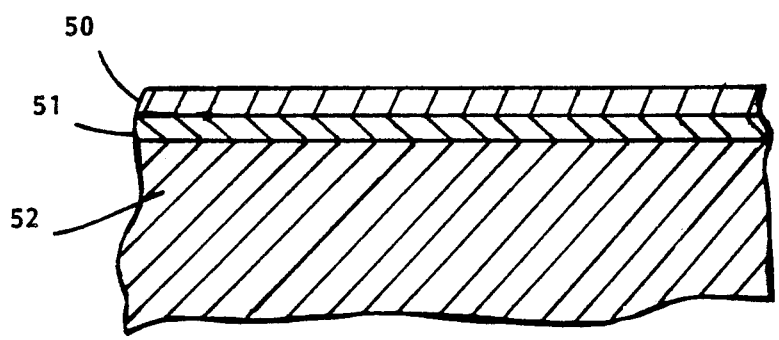
FIG. 7 is a side cross sectional view of section of a fastener with a substrate and synthetic coatings.

In FIG. 7 is shown structural details of the synthetic diamond coatings, the protective overcoatings and the substrates coated. The substrate, which may be any of the configurations hereinabove described, is denoted 50 and is made of suitable metal, metal alloy, ceremet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 52 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

Certain modifications to the structures and methods for making same may be found in my parent application Ser. No. 32,307, now U.S. Pat. No. 4,859,493 and in pending patent application Ser. No. 032,352 filed Mar. 31, 1987, reference being made directly thereto as part of the instant disclosure. Further modifications are noted as follows:

1. Scanning a select portion or portions of the surface or surfaces of the articles described and illustrated in the drawings with one or more radiation beams of laser and/or electron radiation may be effected to provide such coating or coatings on a select area or areas of the outer suface or surfaces of the articles to the exclusion of another area or areas thereof for functional and/or economic purposes. Such an electon beam or laser beam may be employed in combination with microwave radiation and passed through a carbon atom containing gas, such as methane, surrounding all or part of the article or assembly to be coated, and employed to effect or increase the rate of deposition of carbon atoms to form the synthetic diamond coating and/ or to heat the substrate to bond the deposited material(s) to the substrate.

2. Such functions as the operation of the radiation beam generating means, the intensity and frequency thereof, if varied, the direction and focus thereof, the flow and replenishment of carbon atom containing gas and hydrogen gas to the reaction chamber and, if employed, flow thereof as one or more streams within such chamber to the vicinity of the surface(s) being coated, the movement and/or prepositioning of the article or material being coated to, within and from the reaction chamber and the flow of any additional material, to be combined with the carbon atoms in the coating, to the reaction chamber and surface of the article(s) being coated, may all be automatically controlled by a computer with or without the generation of feedback signals generated by one or more sensors of such variables as deposited coating thickness, rate of deposition, temperature, beam position, article position, etc.

3. Synthetic diamond coatings as described may be overcoated with protective coatings of chromium, alloys containing chromium, metal alloys containing such metal atoms as vanadium, tungsten, titanium, molybdenum and/or such metals per se, which serve to protect and/or lubricate the surface of the synthetic diamond coatings to resist frictional wear and abrasion during operation and use of the coated article. In certain applications, the synthetic diamond coating will serve to electrically insulate the article. In others, it will protect the surface coated therewith from heat and/or chemical corrosion. In others, the surface(s) coatings will impart greater resistance to wear and abrasion. Surface attrition due to impact forces and loading during use may also be lessened or eliminated by such hard synthetic diamond coating(s) which may be applied as a single or plurality of layers per se or combined or overcoated with one or more layers of the described metals and/or metal alloys to lubricate and protect the surface of the synthetic diamond coating.

4. Coatings formed of a plurality of layers of synthetic diamond material formed as described between respective layers of the same or different metals, metal alloys and/or ceraimic materials may be employed to enhance the physical, chemical resistance and electrical characteristics of the articles described. Such multiple coatings may also be employed to substantially enhance the strength and stiffness of the articles.

5. Certain of the articles of manufacture described above may be fabricated by compressing particles of metal, various ceramic materials or mixtures of either or both materials with fine particles of synthetic diamond produced, for example, as set forth in my U.S. Pat. No. 4,859,493 and employed to strengthen the composite. Short filaments of synthetic diamond or composites thereof set forth in such patent may also be mixed with such particulate material(s) to form articles of the type(s) described herein having superior substrate strength and corrosion resistence. Compression of such mixture(s) between dies with or without the addition of a resin binder while simultaneous and/or sequentially heating same to effect sintering or otherwise consolidating the metal particles into a defined shape may be effected prior to the described coating with synthetic diamond material.

6. The described articles may also be formed by compressing particulate material with resinous binder particles, then sintering at temperature to burn away the resin leaving a porous substrate of desired shape. By placing such porous substrate in a chamber containing a mixture of hydrocarbon gas and hydrogen under pressure, molecules of the gas mixture will flow into the pores or intersticies of such substrate, particularly if the chamber and substrate therein are first subjected to suitable vacuum. Thereafter by generating and directing suitable microwave energy through the gas and substrate, carbon atoms will be stripped from the gas molecules containing same and will form as synthetic diamond or diamond-like material on the surfaces of the walls of the internal interstices, thus providing a new high strength structure of select external shape which is internally reinforced with synthetic diamond material and is externally coated with such material providing a hard outer shell which is highly resistant to erosion, surface attrition, wear and chemical corrosion.

7. The term synthetic diamond material employed herein refers to high strength coatings, filaments or particles of carbon exhibiting the chemical and physical characterics (e.g. strength) of diamond. For certain of the articles and applications described above, the carbon atoms stripped from the molecules of hydrocarbon gas, such as methane, by microwave energy may form hard high strength coatings which do not quite exhibit the hardness of diamond but will suffice for many applications.

8. Other devices which may be similarly processed and coated with synthetic diamond material deposited as one or more layers of carbon atoms stripped from molecules of carbon atom containing gas, such as methane, in the presence of hydrogen include fasteners, pins, screws and other devices employed within the bodies of living beings where longivity and resistance to corrosion are essential. The entire metal components or mating surfaces of such devices as ball and socket joints employed as replacements for body and limb joints may be similarly treated and double coated to provide resistance against surface failure and the extension of surface defects by means of the synthetic diamond coating and lubrication by means of the dry lubricating coating thereon (e.g. chromium or the like).

9. Marine and aircraft fittings and devices subject to chemical corrosion, high velocity particle erosion and high temperature corrosion and ablation, may be similarly treated and coated. For example, marine propellers made of brass, titanium, stainless steel or other material may be entirely coated with a layer of synthetic diamond material which is overcoated with chromium or one or more of the surface protecting materials as described. Aircraft propellers made of aluminum alloy, titanium or other metal or metal alloy may be similarly ocated with synthetic diamond with an overcoating as described herein and as set forth in my copending application entitled Gas Turbine Components and Blades Therefor filed Mar. 5, 1990 to protect same from the highly erosive effects of particles in the atmosphere.

10. Large aircraft, marine and land vehicle components made of high strength, light weight filament and woven reinforcements plastic such as vehicle body, frame, support and flight surface components, may be similarly coated with synthetic diamond material deposited thereon from carbon atoms stripped from carbon atom containing molecules of gas, such as methane in the presence of hydrogen, by means of radiation such as microwave radiation, as described above. Such coating, with or without an overcoating of surface protecting chromium or other metal, alloy, oxide, nitride, carbide or the like, may be applied to the surface or outer surfaces of the composite material, which may be so called carbon/carbon composite material, or on a layer of suitable material deposited against the surface being so coated. Since carbon/carbon composites are difficult to bond a transition layer of a suitable metal, a plurality of metals or alloy may be applied to the carbon/carbon surface which may consist of graphitized rayon-fibre cloth in a glassy carbon matrix processed at 1,500° C. The surface thereof to be protected is first cleaned in methanol and baked at 100° C. for at least one hour to drive out hydrocarbons and unpyrolized phenolic resin. Radio frequency sputtering, intense laser beam scanning in argon or other means may be employed to remove a thin layer of such contaminants as water vapor, oxides and any residual hydrocarbons. A film of metal such as chromium, nickel-chromium or other alloy is then sputtered by radio frequency sputtering in argon gas onto the surface after which one or more transition layers of metal may be applied by vapor and/or flame or plasma arc deposition prior to applying the synthetic diamond material as a thin coating or film thereon. The initally applied metal film may be composed, for example, of 80% nickel and 20% chromium.

11. Large flight components made of metal, carbon/carbon composites or other high strenth materials, such as nose cones, cowlings, turbine housings and supports as set forth in said copending patent application, and the like may be similarly treated and coated with synthetic diamond material and a protective overcoating as described.

What is claimed is:

1. A machine screw made of metal having a shank portion of generally circular cross sectional shape, a thread formed in at least a portion of said shank portion, said thread being coated with a hard synthetic diamond material.

2. A machine screw in accordance with claim 1 including a solid lubricant coating and protecting said synthetic diamond material coating said thread.

3. A machine screw in accordance with claim 2 wherein said solid lubricant is chromium.

4. A machine screw in accordance with claim 1 wherein said machine screw contains a head larger in diameter than said shank and the entire outer surface of said machine screw including said head is coated with said synthetic diamond material.

5. A machine screw in accordance with claim 4 including a hard surfacing material coated against the outer surface of said synthetic diamond material for protecting same against corrosion.

6. A machine screw in accordance with claim 5 wherein said hard surfacing material comprises a thin layer of chromium.

7. A machine screw in accordance with claim 6 wherein said layer of chromium is electroplated on the outer surface of said diamond coating.

8. A machine screw in accordance with claim 1 having a thin layer of protective material coated on the outside surface of said hard synthetic diamond material covering said thread and formed of a metal, alloy, carbide, nitride, or oxide of a metal selected from the group of metals including chromium, vanadium, titanium, tungsten and aluminum.

9. A machine screw in accordance with claim 1 wherein said synthetic diamond material is applied in a thickness in the range of 0.0001" to 0.005".

10. A fastener having a head and a shank extending from said head with said head adapted to engage and retain said fastener in assembly with work, a synthetic diamond material deposited against said head and said shank of said fastener in a thickness in the range of 0.0001" to 0.010" and operable to strengthen said fastener in a manner to increase its tensile strength and the load at which said head will fail, said synthetic diamond material also serving to protect said fastener from corrosion and prevent the formation and spread of cracks in the surface stratum of said fastener.

11. A fastener in accordance with claim 10 having a protective coating of chromium deposited over said synthetic diamond material.

12. A fastener in accordance with claim 10 wherein at least a portion of said shank of said fastener is threaded and contains at least one helical thread formation formed on a surface thereof, said synthetic diamond material coating the entire helical thread formation.

13. A fastener in accordance with claim 12 having a high strength solid lubricating material deposited as a layer on said synthetic diamond material coating said helical thread formation formed in said shank to protect the surface of said synthetic diamond material and reduce sliding friction when said threaded shank is turned in a threaded hole during an assembly or disassembly operation.

14. A fastener in accordance with claim 10 having a lock washer assembled to said fastener for locking said fastener to a workpiece, said lock washer being coated with synthetic diamond material.

15. A fastener in accordance with claim 10 having a threaded nut turned onto the threaded portion of said shank and assembled with said fastener, the thread of said nut being coated with synthetic diamond material and having a solid lubricating material coating the outer surface thereof.

16. A fastener formed of metal with a surface portion of said fastener adapted to be compressively engaged against an object surface formed of a different material during a fastening operation, means for protecting said fastener against corrosive chemical interaction between the materials of said fastener and said object comprising a coating of synthetic diamond material integrally bonded to a portion of the surface of said fastener which engages the surface of said object, said synthetic diamond material extending against a sufficient portion of the surface of said fastener to prevent chemical reaction between said fastener and said object when moisture deposits on said fastener and the surface of said object adjacent thereto.

17. A fastener in accordance with claim 16 having a head portion and a shank portion wherein said head portion is adapted to be drawn against the surface of an object when said fastener is used in a fastening operation involving said object, and wherein a portion of the surface of said head portion engages a portion of the surface of said object, said portion of said surface of said head portion of said fastener engaging the surface of said object being coated with said synthetic diamond material, said synthetic diamond material extending from said head portion to said shank portion of said fastener.

18. A fastener in accordance with claim 17 having the entire head portion of said fastener and the shank portion thereof coated with said synthetic diamond material.

19. A fastener in accordance with claim 16 having a portion thereof threaded, said threaded portion of said fastener being coated with said synthetic diamond material.

* * * * *